United States Patent
Garcia

(10) Patent No.: US 7,948,194 B2
(45) Date of Patent: May 24, 2011

(54) WAVEFORM CURRENT MONITOR USING RDSON OF LOW-SIDE BRIDGE FET

(75) Inventor: Richard Ralph Garcia, Nederland, CO (US)

(73) Assignee: Intersil Americas Inc., Milpitas, CA (US)

(*) Notice: Subject to any disclaimer, the term of this patent is extended or adjusted under 35 U.S.C. 154(b) by 436 days.

(21) Appl. No.: 12/248,355

(22) Filed: Oct. 9, 2008

(65) Prior Publication Data
US 2009/0206785 A1 Aug. 20, 2009

Related U.S. Application Data

(60) Provisional application No. 61/029,145, filed on Feb. 15, 2008.

(51) Int. Cl.
*H02P 23/00* (2006.01)

(52) U.S. Cl. .............. 318/400.28; 318/494; 318/798; 318/254.1; 318/490; 363/17; 363/16; 363/74; 363/95; 363/98; 363/27; 363/96; 327/108; 327/110

(58) Field of Classification Search .............. 318/494, 318/254.1, 490, 798, 400.28; 363/17, 98, 363/74, 95, 16, 27, 96; 327/108, 110
See application file for complete search history.

(56) References Cited

U.S. PATENT DOCUMENTS

| 5,642,247 | A | 6/1997 | Giordano | |
|---|---|---|---|---|
| 6,952,123 | B2 * | 10/2005 | Kizer et al. | 327/147 |
| 7,088,063 | B2 * | 8/2006 | Kurosawa et al. | 318/400.35 |
| 7,294,982 | B2 * | 11/2007 | Kurosawa et al. | 318/400.2 |
| 7,812,647 | B2 * | 10/2010 | Williams | 327/110 |

FOREIGN PATENT DOCUMENTS

JP 2004-247834 9/2004

OTHER PUBLICATIONS

PCT: Notification of Transmittal of the International Search Report and the Written Opinion of the International Searching Authority of PCT/US2009/031480, Jun. 30, 2009; 10 pages.

* cited by examiner

*Primary Examiner* — Rita Leykin
(74) *Attorney, Agent, or Firm* — Howison & Arnott, LLP

(57) ABSTRACT

An apparatus for monitoring current for a motor drive including at least high-side and low-side switching transistors includes a driver circuit for driving a gate of the low-side switching transistor. First circuitry measures a drain to source voltage across the low-side switching transistor and generates a voltage output responsive thereto. Second circuitry has a first state of operation that samples the voltage output of the first circuitry when the low-side switching transistor is turned on and has a second state of operation to sample the voltage output of the first circuitry when the low-side switching transistor is turned off. The second circuitry further generates a monitored output current responsive to the sampled voltage output.

16 Claims, 9 Drawing Sheets

US 7,948,194 B2

WAVEFORM CURRENT MONITOR USING RDSON OF LOW-SIDE BRIDGE FET

CROSS-REFERENCE TO RELATED APPLICATIONS

This application claims benefit of U.S. Application Ser. No. 61/029,145, filed Feb. 15, 2008, and entitled WAVEFORM CURRENT MONITOR USING RDSON OF LOW-SIDE BRIDGE FET, which is incorporated herein by reference.

TECHNICAL FIELD

The present invention relates to waveform current monitors, and more particularly, to a waveform current monitor using the RDSon voltage of a low-side FET.

BACKGROUND

When operating H-bridge or three phase bridge motor drive circuits there is a need to be able to reconstruct the current wave form and phase of the motor currents such that an AC signal with a DC offset may be achieved. H-bridge motor drives and three phase bridge motor drives are circuit configurations used for driving an electrical motor using a combination of two high-side switches and two low-side switches for full bridge configurations and using a combination of tree high-side switches and three-low side switches for three phase bridge configurations. When operating H-bridge or three phase bridge motor circuits, there is a need to be able to reconstruct the current waveform and phase of the motor currents. Existing methods for monitoring the current within these types of circuits involve creating an instantaneous average current from the leading and trailing edge samples of the "on" period of a switching power FET. An improved method of these designs is desired wherein the instantaneous average current may be determined both during the "on" period of the switching power FETs and during the "off" period of the switching cycle. Thus, circuitry enabling current monitoring during the "on" and "off" periods of the switching cycle would be desirable.

SUMMARY OF THE INVENTION

The present invention, as disclosed and described herein, in one aspect thereof, comprises an apparatus for monitoring currents for a motor drive including at least high-side and low-side switching transistors. The apparatus includes a driver circuit for driving a gate of the low-side switching transistor. The first circuitry measures a drain to source voltage across the low-side switching transistor and generates an output voltage responsive thereto. Second circuitry has a first state of operation for sampling the voltage output of the first circuitry when the low-side switching transistor is turned on. The second circuitry further includes a second state of operation for sampling the voltage output of the first circuitry when the low-side switching transistor is turned off. The switching transistor generates a monitored output current responsive to the sampled voltage output.

BRIEF DESCRIPTION OF THE DRAWINGS

For a more complete understanding, reference is now made to the following description taken in conjunction with the accompanying Drawings in which.

DETAILED DESCRIPTION

Figure 1:
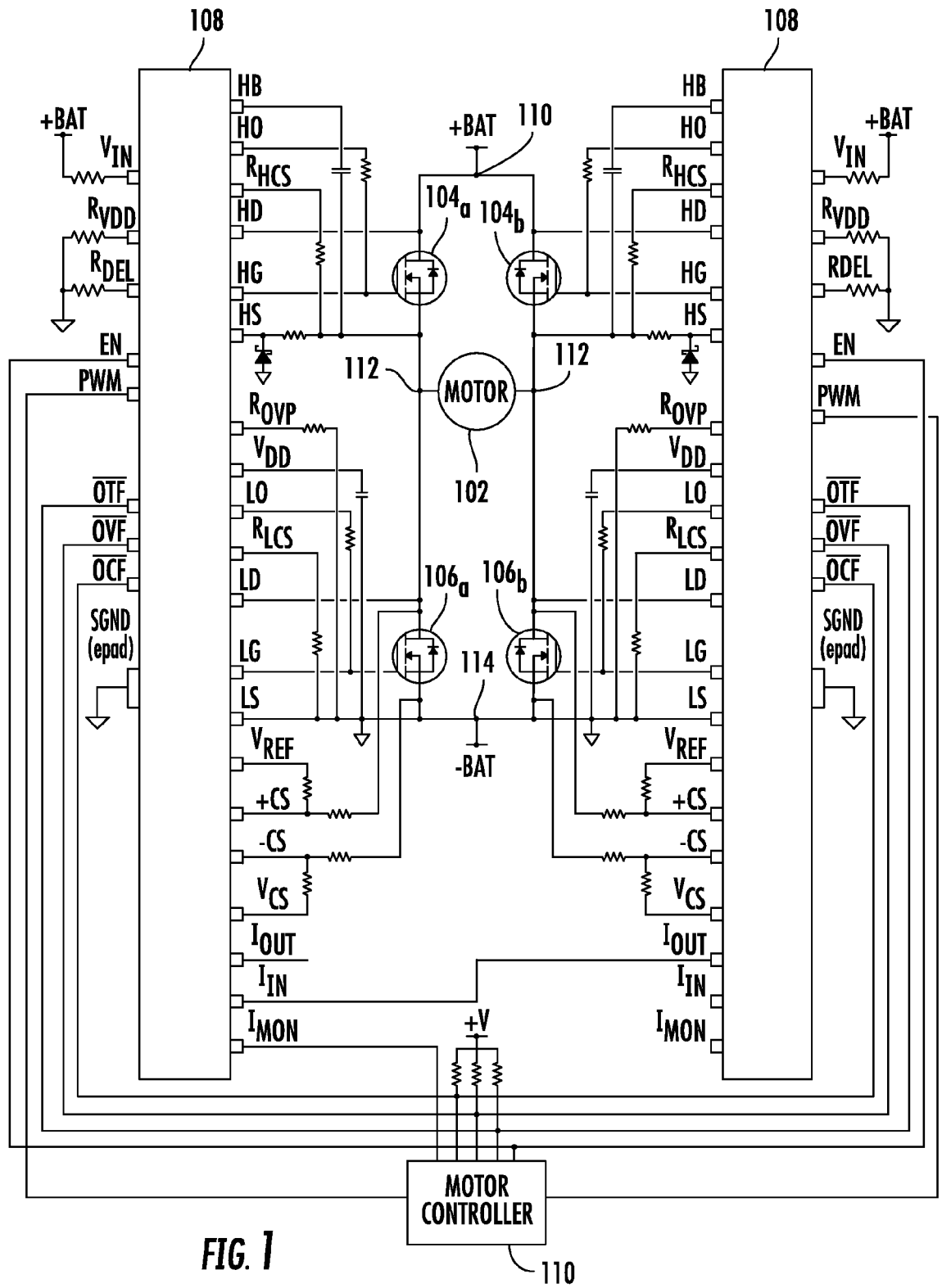
FIG. 1 illustrates an H-bridge motor drive configuration wherein the circuitry of the present disclosure may be implemented.

Referring now to the drawings, wherein like reference numbers are used herein to designate like elements throughout, the various views and embodiments of waveform current monitor using RDSon of a low-side bridge FET are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Although the preferred embodiment has been described in detail, it should be understood that various changes, substitutions and alterations can be made therein without departing from the spirit and scope of the invention as defined by the appended claims.

Referring now to the drawings, and more particularly to FIG. 1, there is illustrated a configuration of an H-bridge motor drive in which the current monitoring circuitry of the present invention may be implemented. An H-bridge drive is an electronic circuit which enables DC electric motors 102 to be run forwards or backwards. An H-bridge drive is built using four switches 104a, 104b, the high-side switches and switches 106a and 106b, the low-side switches. When the high-side switching transistor 104a and the low-side switching transistor 106b are turned on and the high-side switch 104b and low-side switch 106a are turned off, a positive voltage will be provided across the motor 102 enabling forward operation. By turning off switches 104a and 106b and turning on switches 104b and 106a, a negative voltage is applied across motor 102 allowing reverse operation of the motor. Switches 104a and 106a are never closed at the same time to prevent causing a short circuit on the input voltage source. This same rule applies to switches 104b and 106b.

The H-bridge configuration of FIG. 1 is generally used to reverse the polarity of the motor 102, but can also be used to brake the motor, when the motor comes to a sudden stop, as the motor's terminals are shorted, or to let the motor free run to a stop as the motor is effectively disconnected from the circuit. In the configuration of FIG. 1, the motor 102 is connected to a pair of high-side switching field effect transistors (FETs) 104 and a pair of low-side FETs 106. The high-side FETs 104 and low-side FETs 106 are connected to integrated circuits 108 that are used for driving the switching transistors 104 and 106 to operate the motor as described previously, and also include the current monitoring circuitry as will be further described herein below. A motor control circuit 110 is connected to each of the integrated circuits 108 for controlling their operation.

Figure 2:
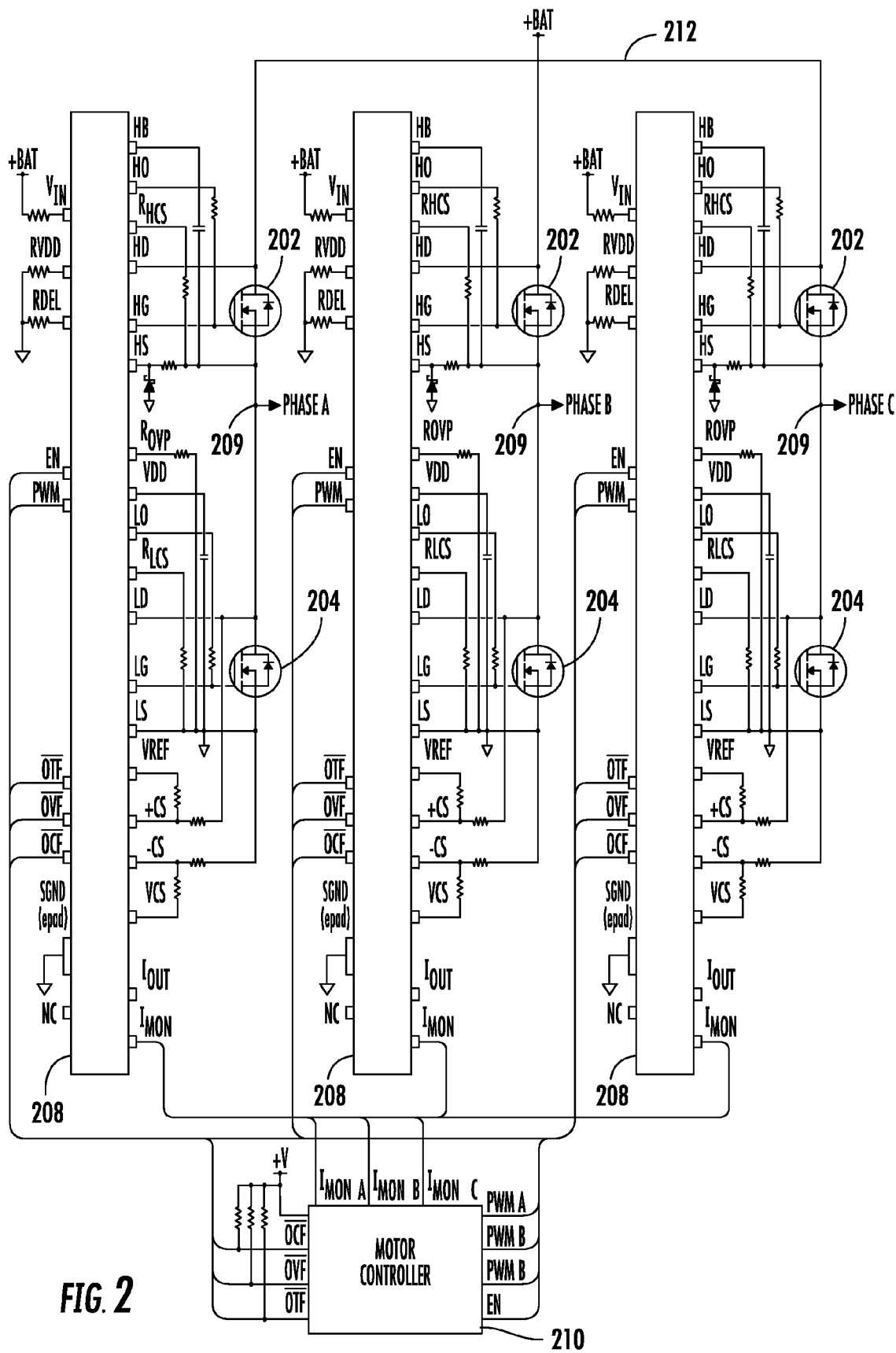
FIG. 2 illustrates a three phase bridge motor drive wherein the circuitry of the present invention may be implemented.

Referring now to FIG. 2, there is illustrated a configuration of a three phase bridge motor drive. The three phase bridge motor drive consists of high-side switching FETs 202 and low-side switching FETs 204. A separate high-side switching FET 202 and low-side switching FET 204 are connected with each of the output phases, phase A, phase B and phase C, respectively of the motor. The battery for driving the circuit is connected to the three phase bridge motor drive at node 212. The high-side FETs 202 and low-side FETs 204 are also connected to integrated circuits 208 for driving the transistors 202 and 204 and for monitoring the current provided by the three phase bridge motor drive to each of the phase nodes 209. The integrated circuits 208 are controlled by a motor control circuit 210 interconnected with each of the integrated circuits 208.

Figure 3:
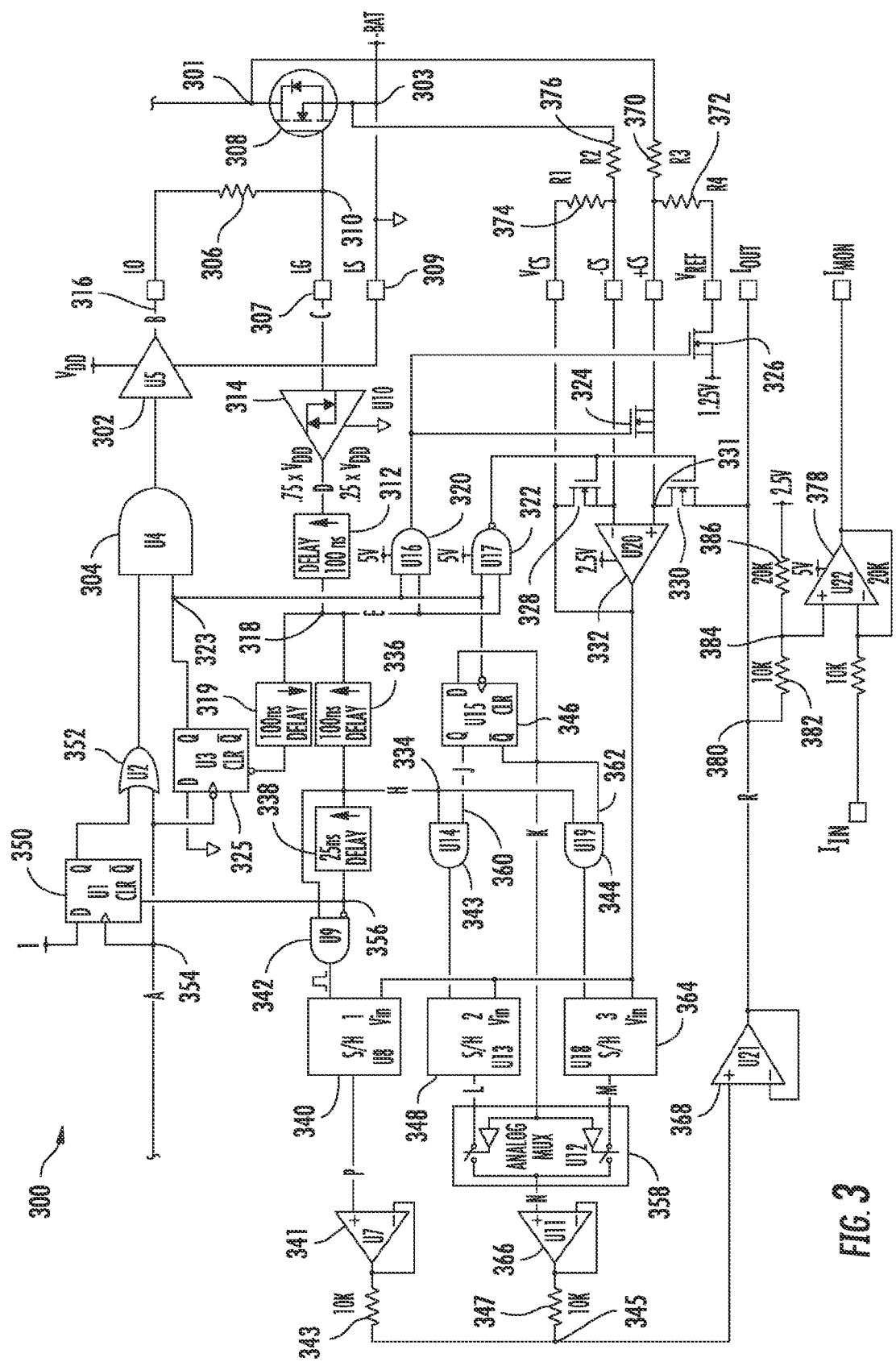
FIG. 3 illustrates the current monitoring circuitry of the present disclosure.

Referring now to FIG. 3, there is illustrated the circuitry for monitoring the current using a low side switching transistor 308. Transistor 308 has its drain source path connected between node 301 and node 303. Node 301 connects with the source of the high-side switching FET within either the H-bridge drive or three phase drive motor configuration. The low-side transistor source is connected at node 303 with a negative battery terminal. A driver 302 has its output connected to LO pin 316 of the integrated circuit 300 which is used for driving the low-side switching transistor 308. Connected between the LO pin 316 and a gate node 310 is a resistor 306. The gate node 310 is also connected to the LG pin 307 of the integrated circuit 300. The LG pin 307 monitors the gate voltage of transistor 308 and is connected to a drive circuit 314 whose output is connected to a leading edge blanking circuit 312 which provides a 100 ns delay to the output of the drive circuit 314. The output of leading edge blanking (LEB) circuit 312 is connected to node 318 to the input of 100 ns delay circuit 319, 100 ns delay circuit 336 and to an input of two separate AND gates 320 and 322, respectively. The second input of AND gates 320 and 322 are connected to the output of a flip-flop 325. The output of flip-flop 325 is additionally connected to the clock input of a flip-flop 346 into an input of AND gate 304.

The output of delay circuit 319 is connected to a CLR input of flip-flop 325. The D input of flip-flop 325 is connected to ground while the Q output is connected to node 323 as an input to the AND gate 304. The clock input of flip-flop 325 is received from node 354. Node 354 receives the input signal that eventually turns on and off FET 308. To insure that a high pulse is sufficiently long to allow the opamp 332 to slew to it new output state after FET 308 turns on, flip-flop 350 forces the output of OR gate 352 to remain high until the rising edge delays of delay 338 and delay 336 clear flip-flop 350 which then results in FET 308 turning off. When the input signal on node 354 goes low, flip-flop 325 forces the minimum low pulse to be low long enough for the opamp 332 to slew to the new output state which is now the average of the leading and trailing edge sample of the previous "on" pulse. The falling edge delay of delay circuit 319 clears the latch allowing the next on pulse to begin. The CLR input of flip-flop 350 is connected to node 356. Node 356 receives a signal that has a further 25 ns delay from delay circuit 338 that is received from delay circuit 336. Delay circuits 338 and 336 are interconnected at node 334.

The Q output of flip-flop 350 and the input from node 354 are applied to the inputs of an OR gate 352. The output of OR gate 352 is provided to the other input of AND gate 304. The output of AND gate 304 is provided through a drive circuit 302 which drives the gate signal from the LO pin 316 to node 310 that drives the low-side switching transistor 308.

As mentioned previously, the output from node 318 is applied through a 100 ns delay circuit 336. The output node 334 of the 100 ns delay circuit is connected to the input of an AND gate 342, the input of a 25 ns delay circuit 338, an input of AND gate 343 and an input of AND gate 344, the output of AND gate 342 also has an inverting input from the 25 ns delay circuit 338. The output signal of the AND gate 342 comprises a 25 ns one shot signal as applied to a sample and hold circuit 340.

A second sample and hold circuit 348 is connected to the output of AND gate 347. The AND gate 343 in addition to having an input connected to node 334 has an input connected to node 360 from the Q output of a flip-flop 346. A third sample and hold circuit 364 has an input connected to the output of AND gate 344 which has one input connected to node 334 and a second input connected to the $\overline{Q}$ output of flip-flop 346.

The output of sample and hold circuit 340 is a positive input of amplifier 341. The negative input of amplifier 341 is connected to its output and a resistor 343 is connected in series with the output of amplifier 341. The output of the sample and hold circuit 348 and the sample and hold circuit 364, are each connected to an analog multiplexer 358. One output of the analog multiplexer 358 is provided to a positive input of an amplifier circuit 366. The negative input of amplifier 366 is connected with its output and in series through a resistor 347. The ends of resistors 343 and 347 are connected with each other respectively at node 345. The Analog Mux 358 also is connected to receive an input from the $\overline{Q}$ output of the flip-flop 346 and is also connected to the D input of the flip-flop 346. Another amplifier 368 has its positive input connected to node 345 and its negative input connected to its output. The output of amplifier 368 provides the average of leading and trailing edge samples for the monitor current through the switching transistor 308. An output node 380 is connected to the $I_{OUT}$ pin of the integrated circuit 300 at the output of the amplifier 368. A resistor 382 is connected between node 380 and node 384 connected to a positive input of an amplifier 378. A 2.5V voltage is applied to node 384 through a resistor 386. The output of amplifier 378 is connected to the $I_{MON}$ pin of the integrated circuit 300.

An amplifier 332 has its output connected to the input voltage pins of sample and hold circuits 340, 348 and 364. The output of the amplifier 332 is also connected to the $V_{CS}$ pin of the integrated circuit. The negative input of amplifier 332 is connected to the output of inverted AND gate 322. The differential amplifier 332 is used to amplify and level shift the sensed voltage across the low side switching transistor 308 or a current sensing resistor connected to the source of the low side switching transistor 308. This allows the waveform and phase of the motor current to be fully reconstructed giving an AC signal with a DC offset. The differential amplifier 332 is configured as a level shifting differential amplifier when the current sense voltage is being sampled during the "on" time of low-side switching transistor 308. When the low-side switching transistor 308 is turned "off", the differential amplifier 332 is reconfigured as a unity gain buffer with the previously averaged sensed voltage as an input. This biases is the output of the differential amplifier 332 to have an optimal output voltage to minimize the settling time for the next leading edge sample. During the "off" period, the inputs of the differential amplifier 332 are disconnected from the external gain setting resistors to prevent excessively high voltage from being applied to the inputs of the differential amplifier 332. Disconnecting these resistors during the "off" period also allows low power rated resistors to be used. By level shifting the current sense voltage across the RDSon voltage at the low side switching transistor 308 or across a discrete resistor connected to the source of the low side switching transistor 308 the output monitor waveform is unipolar (does not have a negative voltage component).

A transistor 328 has its drain source path connected between the output of amplifier 332 and the negative input of amplifier 332. The gate of transistor 328 is connected to the inverted output of AND gate 322. The positive input of amplifier 332 is connected to the drain of a transistor 330 at node 331. Transistor 330 has its drain source path connected between node 331 and node 380. The gate of transistor 330 is connected to the inverted output of AND gate 322. The output of AND gate 320 is connected to a transistor 324 having its drain source path connected between node 331 and the +CS output of the integrated circuit 300. The output of AND gate 320 is also connected to transistor 326 having its drain source path connected between a 1.25V source and the $V_{REF}$ pin of the integrated circuit 300. The source of low-side switching transistor 308 is connected to node 303 and through a resistor 376 to the –CS pin of the integrated circuit 300. A resistor 374 is connected between the $V_{CS}$ pin and the –CS pin. A drain of the low-side switching transistor 308 is connected at node 301 to a resistor 370 that is connected to the +CS pin at the integrated circuit 300. A resistor 372 is connected between the +CS pin and the $V_{REF}$ pin of the integrated circuit 300.

Now, a more detailed description of the operation of the current monitoring circuitry illustrated in FIG. 3 will be provided with respect thereto. FIG. 3 illustrates the circuitry for reproducing the current waveform of a full bridge load configuration as illustrated in FIG. 1. The output of the driver circuit 302 drives the gate at the low side external switching MOSFET 308 through resistor 306. The LG input 307 of the integrated circuit 100 senses the gate voltage of the low-side switching FET 308 which initiates the 100 ns timer delay circuit 312 through a drive circuit 314. The 100 ns timer 312 is used to blank the leading edge reverse recovery current of the high-side MOSFET (not shown) body diode.

The LO pin 316 is the output for the low-side driver transistor 308. The LG pin 307 along with the LS pin 309 are used to monitor the gate to source voltage of the low side switching transistor 308. When the gate to source voltage across the low-side switching transistor 308 reaches approximately 75% of VDD, a blanking delay of 100 ns occurs via leading edge blanking circuit 312 before comparison of the voltage across the RDSon (VDS) of the low-side MOSFET is made with the reference voltage on $R_{LCS}$. The LS pin is the dedicated bias supply return for the low-side driver output. This pin is directly connected to the source of the low-side bridge switching transistor 308.

After the 100 ns blanking time, node 316 at the LO pin and node 318 at the output of the leading edge blanking circuit 312 are high causing the outputs of AND gates 320 and 322 to go to a logical "high" level. AND gate 320 asserts a logical high signal turning on transistors 324 and 326. AND gate 322 asserts a logical "low" signal that turns off transistors 328 and 330. In response to the states of transistors 324 through 330, the amplifier 332 is configured as a level shifting differential amplifier. After the settling time of differential amplifier 332 has elapsed, the output of the differential amplifier 332 comprises the RDSon voltage of the low-side switching transistor 308 amplified by 1.25V.

After 100 ns has elapsed to allow the output of the differential amplifier 332 to settle, node 334 opposites the 100 ns delay circuit 336 goes to a logical "high" level asserting the 25 ns one shot delay circuit 338. The one shot delay circuit 338 enables the sample and hold circuit 340 through an AND gate 342. The output of the sample and hold circuit 340 comprises the leading edge sample of a conduction period of a low-side switching transistor 308.

Responsive to node 334 going to a logical "high" level, the output of either AND gate 343 or AND gate 344 goes to a logical "high" level depending on the present state of flip-flop 346. Assuming that AND gate 343 goes to a logical "high" level and AND gate 344 is low, sample and hold circuit 348 starts to sample the output of the differential amplifier 332. However, unlike sample and hold circuit 340, which terminates after 25 ns, the sampling time at sample and hold circuit 348 terminates when the flip-flop 346 is toggled by node 323 to a logical "low" level to turn off the low side switching FET 308. This is the trailing edge sample of the conduction period of the low-side switching FET 308.

To prevent invalid samples of the low-side MOSFET current because of very short "on" periods that could terminate the acquisition time prior to 25 ns, flip-flop 350 and OR gate 352 force the "on" period to not terminate before a valid sample has been acquired. When node 354 transitions to a logical high level, the signal propagates to node 316 through OR gate 352 with minimum delay. Simultaneously, the rising edge at node 354 toggles flip-flop 350 resulting in a logical "high" level on the second input to the OR gate 352 effectively latching node 316 high. Eventually, the "high" state on node 316 propagates to node 334 and 25 ns later (the minimum acquisition time), node 356 transitions to a logical "high" signal clearing the flip-flop 350 which turns off the MOSFET 308. Note that this pulse stretching occurs only for short "on" periods of about 225 ns or less.

When the flip-flop 346 is toggled by falling edge signal on node 316, the analog multiplexer 358 switches channels. If sample and hold circuit 348 is the active circuit, node 360 is high and node 362 is low. While sample and hold circuit 348 is sampling the differential amplifier voltage, the analog multiplexer 358 is connected to the output of sample and hold circuit 364. When the sample time of sample and hold circuit 348 ends, node 362 goes high, disconnecting sample and hold circuit 364 and connecting sample and hold circuit 348 to the unity gain buffer amplifier 366 through analog multiplexer 358.

The outputs of sample and hold circuit 340 and sample and hold circuits 348 or 364 are averaged and buffered by unity gain amplifier 368. $I_{OUT}$ is the monitored current through transistor 308. $I_{OUT}$ is provided at the $I_{OUT}$ pin from the output of the unity gain amplifier 368. $I_{OUT}$ from the output of unity gain amplifier 368 is proportional to the average current as sampled by sample and hold circuit 340 and sample and hold circuit 348 and remains constant until the next sample and hold circuit 340 measurement. After a new sample and hold circuit 340 measurement is acquired, and before sample and hold circuit 364 makes the next measurement, $I_{OUT}$ is now the average of the new sample and hold circuit 340 value and the old sample and hold circuit 348 value. The next trailing edge sample is now acquired by the sample and hold circuit 364 instead of sample and hold circuit 348 because the flip-flop 346 was previously toggled. The new average is now summed with the sample and hold circuit 340 and the sample and hold circuit 364. The cycle then repeats.

The monitoring of the conduction voltage across the low-side switching MOSFET 308 must end before it is turned off. When node 316 goes "low", the outputs of AND gate 320 and AND gate 322 go to a logical "low" level, turning off transistors 324 and 326 and turning on transistors 328 and 330. The differential amplifier 332 is now configured as a unity gain amplifier with the average output of the sample and hold circuit $I_{OUT}$ used as an input. Consequently, the output of the unity gain amplifier 332 is now held at the optimal voltage to minimize the settling time for the next turn on cycle of the low-side MOSFET 308. When 324 and 328 are turned off, excessive dissipation in resistors 370 and 372 is prevented allowing the use of low power resistors. Resistors 374 and 376 are not switched off because they are connected to ground and do not dissipate significant power when the MOSFET 308 is turned off.

Figure 4:
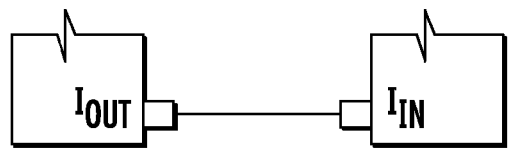
FIG. 4 illustrates pin connections between two circuits for an H-bridge drive.

In a full bridge configuration such as that illustrated in FIG. 1, the current sensed in the low-side switching MOSFET 308 is only for a one half cycle. A second differential amplifier 378 is used to reconstruct the full current waveform. Feeding the $I_{OUT}$ current from one integrated circuit of the other side of the full bridge into the $I_{IN}$ input of this side of the bridge subtracts the other side's $I_{OUT}$ from this side. This configuration is more fully illustrated in FIG. 4. Consequently, the 1.25V offset of $I_{OUT}$ from the other side is subtracted from this side's $I_{OUT}$. To maintain a unipolar output for $I_{MON}$, the signal was level shifted by 2.5V. Also note that the differential amplifier gain of the two results with a full scale output that varies from 0 to 5V DC with a 2.5V offset. This scaling for $I_{MON}$ is used to accommodate commonly used A to D converters.

$I_{MON}$ for a three phase application such as that illustrated in FIG. 2 functions in a manner similar to the full bridge application that is illustrated in FIG. 1. In the three phase case, a current flowing to the low side MOSFET is the complete waveform and does not have to be combined with the output of the other integrated circuit as is the case with a full bridge application. The $I_{IN}$ of one integrated circuit is a NC (Not Connected) for the other which is an unused pin. The $I_{MON}$ output of the integrated circuit varies from 0 to 5V DC with a 2.5V offset.

Figure 6A:
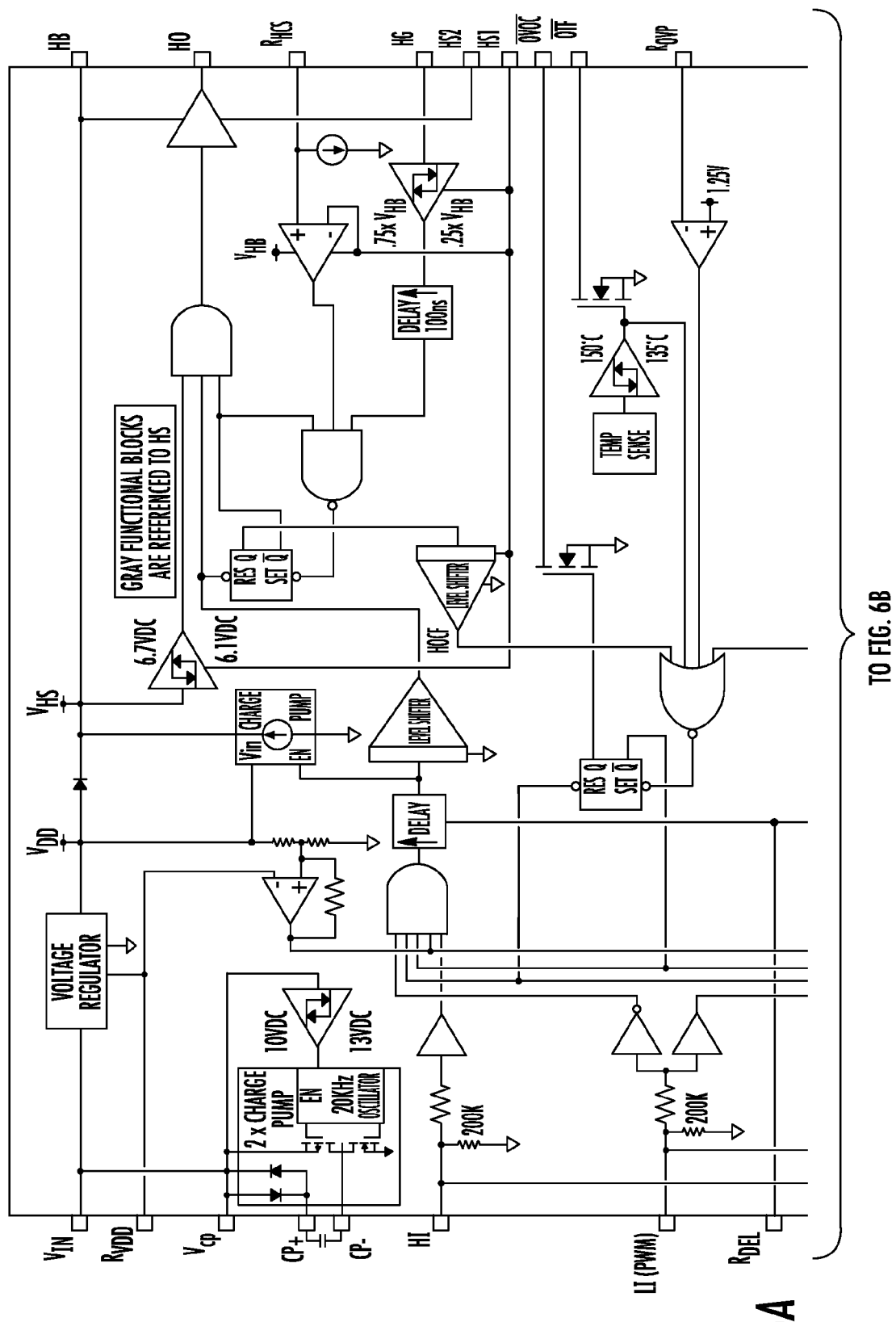
FIGS. 6a-6b illustrates the circuitry of FIG. 3 implemented within a single integrated circuit chip.
Figure 6B:
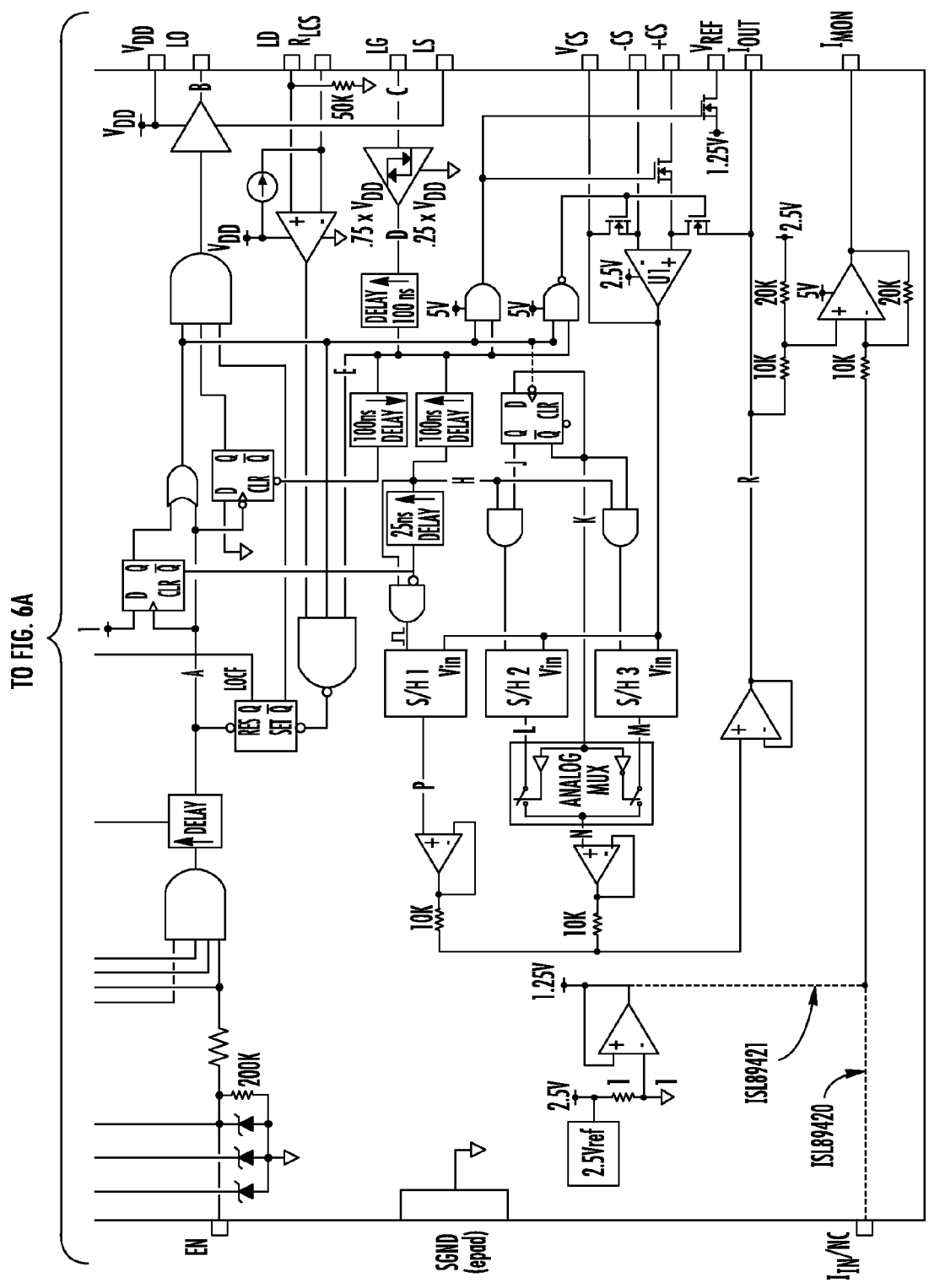

Referring now to FIGS. 6a-6b, there is illustrated the circuitry of FIG. 3 implemented within the integrated circuit 300 for driving switching transistors in either a full bridge configuration as illustrated in FIG. 1 or in the three phase configuration described with respect to FIG. 2.

Figure 5:
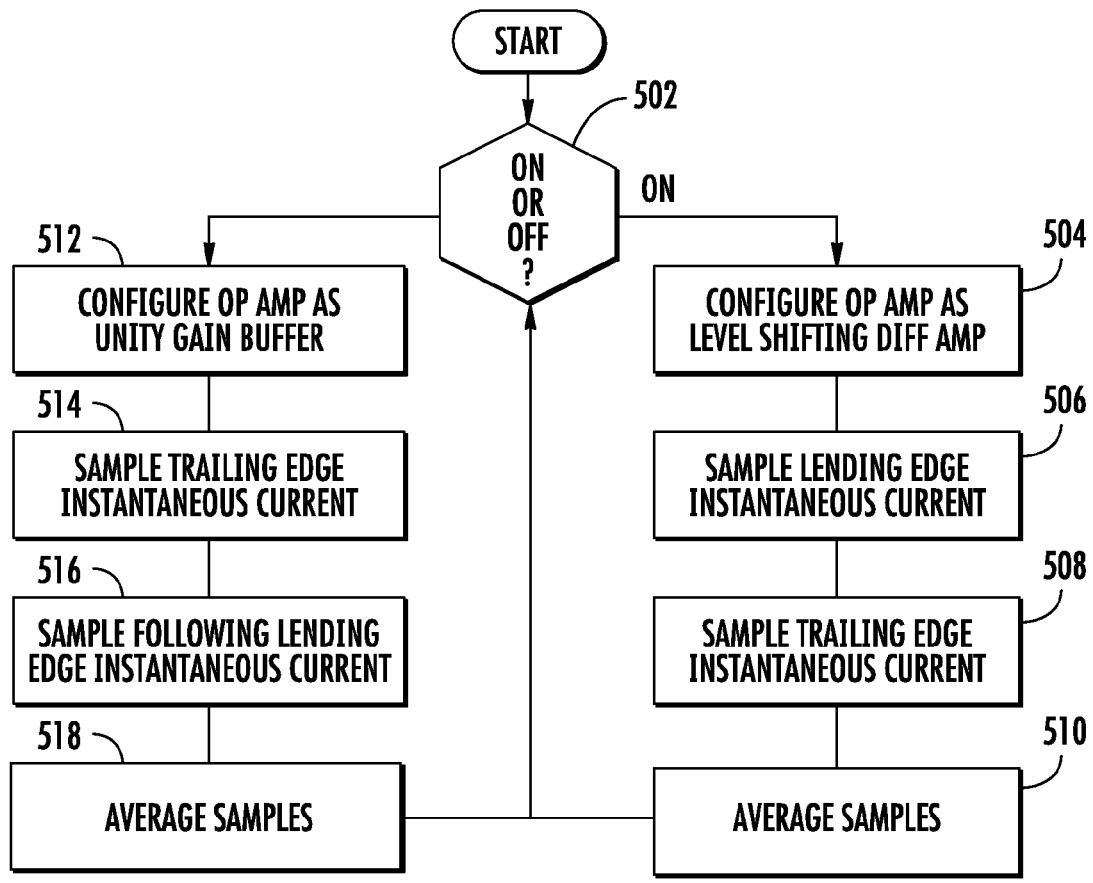
FIG. 5 is a flow diagram describing the operation of the circuitry of FIG. 3 for monitoring a current waveform.

Referring now to FIG. 5, there is illustrated a flow diagram describing the operation on the current monitoring circuitry of FIG. 3. Once the process is initiated, inquiry step 502 determines whether the low-side switching transistor 308 is in an "on" state or an "off" state. If the transistor is in an "on" state, the operation amplifier 332 is configured as a level shifting differential amplifier. While the operation amplifier 332 is configured as a level shifting differential amplifier, the leading edge instantaneous current through the low-side switching transistor 308 is sampled at step 506. Next, the trailing edge instantaneous current through the low-side switching transistor 308 is sampled at step 508. The average current is then determined while averaging the leading and trailing edge samples at step 510 to provide the average current during the "on" period.

If inquiry step 502 determines that the low-side switching transistor 308 is in an "off" state, the operational amplifier 332 is configured as an unity gain buffer at step 512, and the external gain setting resistors are disconnected from the inputs of the amplifier to prevent excessively high voltage from being applied to the inputs of the amplifier 332. Disconnecting these resistors during the "off" period also allows lower power rated resistors to be utilized. The trailing edge sample of the instantaneous current is sampled at step 514 and the leading edge current following this trailing edge instantaneous current is sampled at step 516. These samples are averaged at step 518 to determine the average current during the "off" state. From steps 518 and 510 control passes pack to inquiry step 502 to determine the state of the low-side switching transistor 308.

Figure 7A:
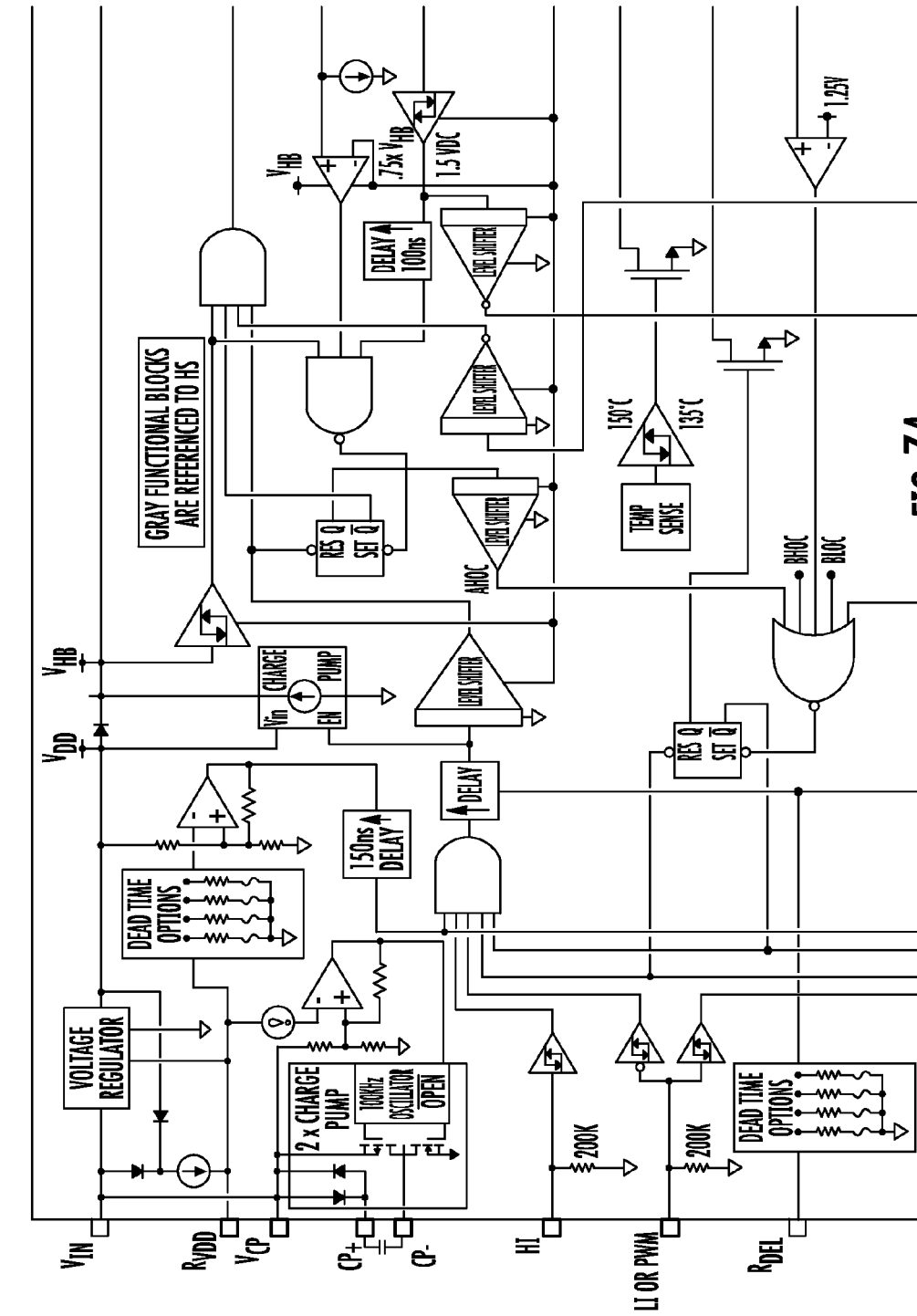
FIGS. 7a-7c illustrate the circuitry of FIG. 3 using a precision current resistor to measure current rather than RDSon.
Figure 7B:
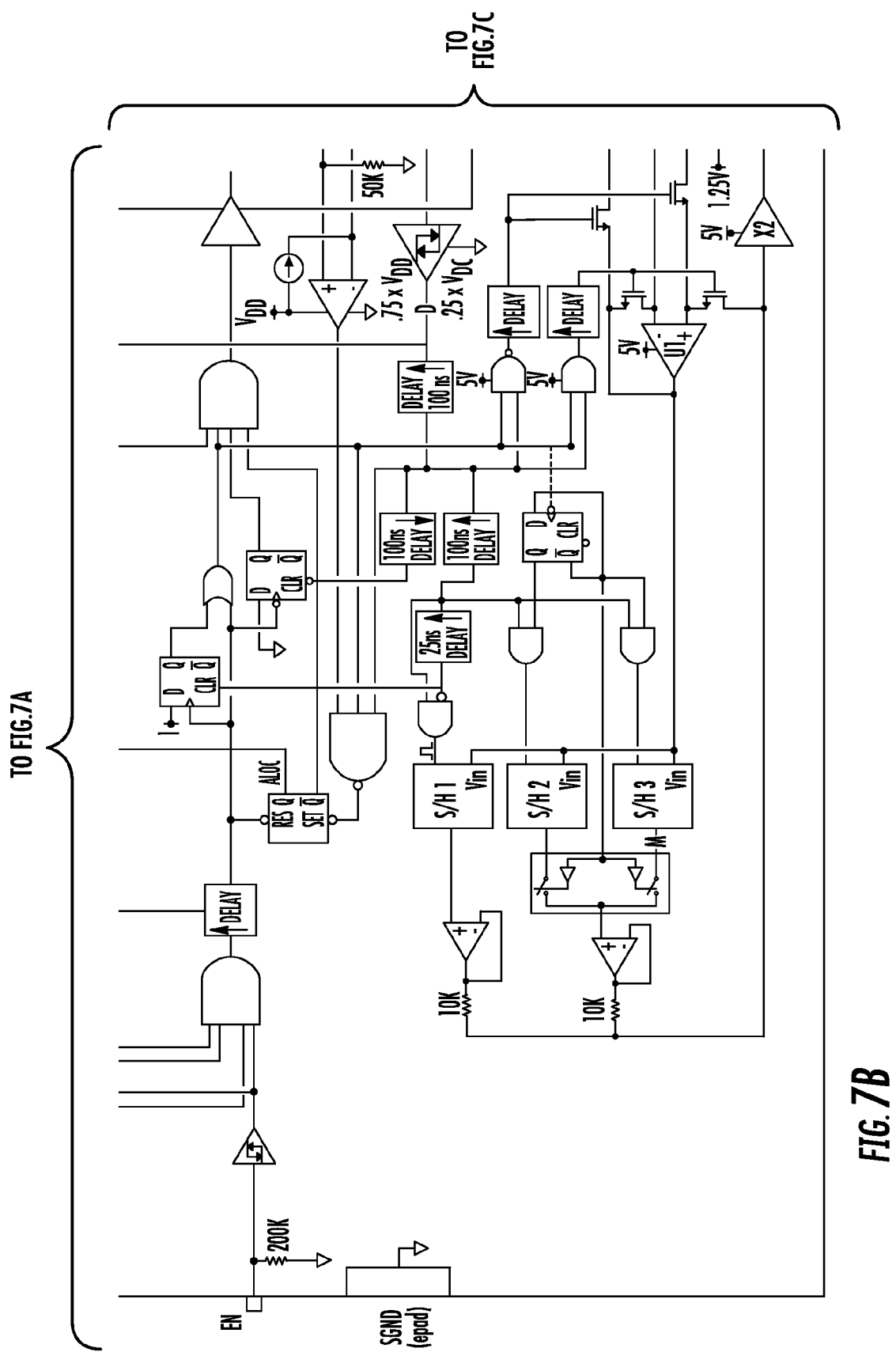
Figure 7C:
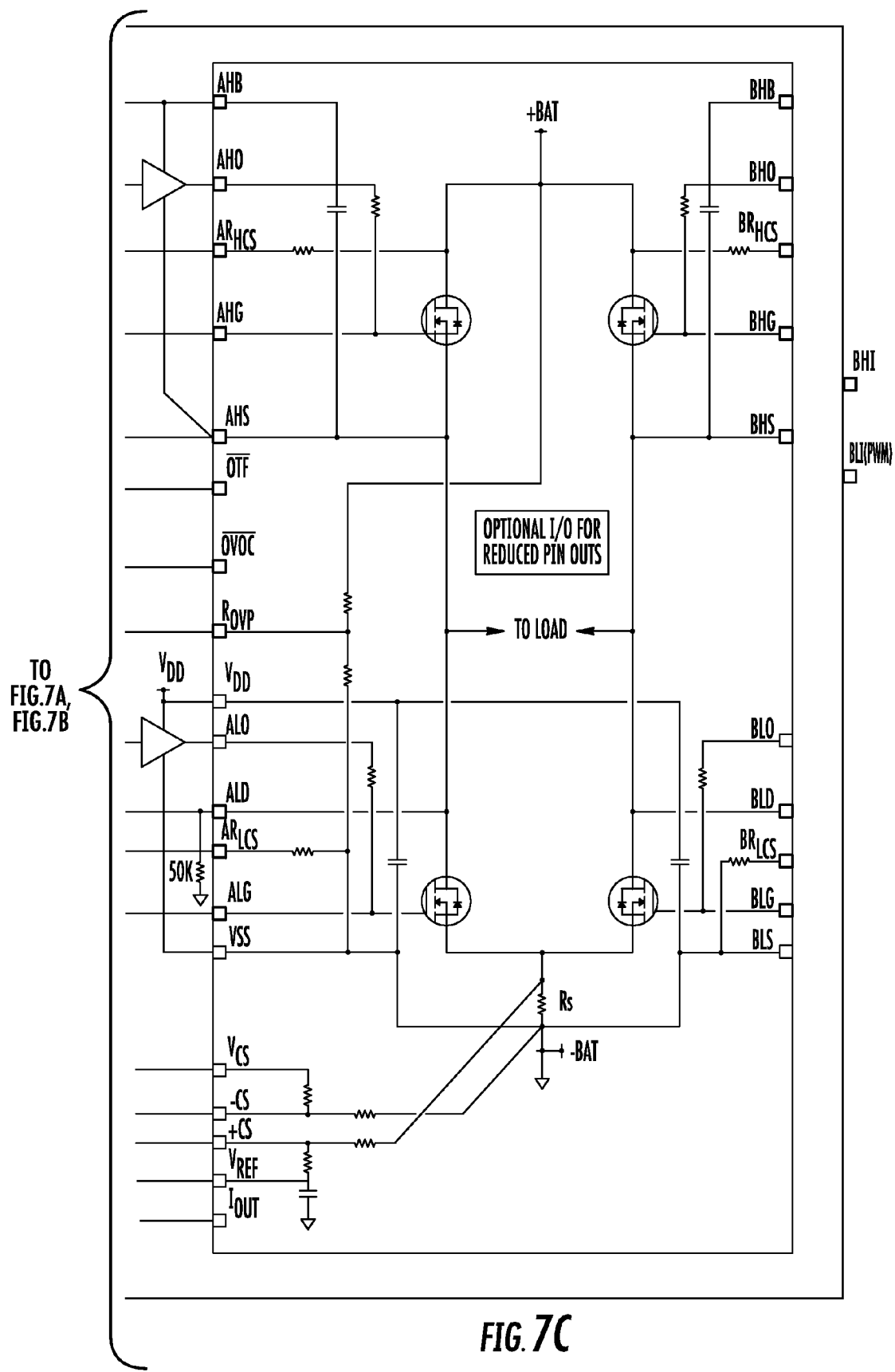

Referring now to FIGS. 7a-7c, as mentioned previously, the circuitry described herein is optimized for using the RDSon of the low side switching transistors. However, the same current monitor can also be used to more accurately measure the current through a precision current resistor as illustrated in FIG. 7. In this case, the inputs −CS and +CS are connected across a precision current sense resistor 702 rather than across the low side switching transistor.

By utilize the current monitoring configuration described herein above, a number of advantages are achieved over existing circuitry. Previous methods require many external parts and complex circuitries in order to sense motor currents while the present configuration minimizes these factors. By incorporating the current monitor function within a half, full or three phase bridge drive integrated circuit, all of the control inputs for the current monitor function are provided in a single package. The use of sample and hold methods to recreate the average current on a cycle by cycle basis provides an accurate waveform current output. The level shifting differential amplifier 332 used to sense the current sense voltage allows either the RDSon of the switching FET 308 to be used or discrete resistor connected to the source of the switching FET 308 may be used when more accuracy is required. Phase shifting of the current monitor AC waveform relative to the actual motor current caused by the filtering of the jump current waveform in the current sensing RDSon or external resistor is avoided by the sample and hold technique described herein. Finally, because the differential amplifier is disconnected from the DVS voltage when the switching low-side switching transistor 308 is turned off, there is a minimal dissipation in the biasing transistors in the output of the differential amplifier is not driven to saturation. All of these provide significant advantages over existing current monitoring configurations.

It will be appreciated by those skilled in the art having the benefit of this disclosure that this waveform current monitor using RDSon of low-side bridge FET provides an improved current monitoring. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An apparatus for monitoring currents for a motor drive including at least high side and low side switching transistors, comprising:
    a driver circuit for driving a gate of a low side switching transistor;
    first circuitry for measuring a drain to source voltage across the low side switching transistor and generating a voltage output;
    second circuitry having a first state of operation for sampling the voltage output of the first circuitry when the low side switching transistor is turned on and having a second state of operation for sampling the voltage output of the first circuitry when the low side switching transistor is turned off, wherein the second circuitry further generates an monitored output current responsive to the sampled voltage output.

2. The apparatus of claim 1, wherein the first circuitry further comprises:
  a differential amplifier; and
  switching circuitry for configuring the differential amplifier as a level shifting differential amplifier in the first state of operation and for configuring the differential amplifier as a unity gain buffer in the second state of operation.

3. The apparatus of claim 1, wherein the second circuitry further comprises:
  first sampling circuitry for sampling the voltage output to generate a leading edge sample;
  second and third sampling circuitry for sampling the voltage output to generate a trailing edge sample; and
  a unity gain amplifier for averaging the leading edge sample and the trailing edge sample to generate the monitored output current proportional to a current through the low side switching transistor.

4. The apparatus of claim 3, further including pulse stretching circuitry for maintaining a turn on time of the low side switching transistor for a sufficient period of time to enable leading edge samples to be generated by the first sampling circuitry.

5. The apparatus of claim 3, further including a differential amplifier for generating a level shifted output current proportional to the current through the low side switching transistor level shifted by a predetermined level.

6. A bridge motor drive circuit, comprising:
  drive circuitry for controlling the operation of an attached motor;
  interface pins associated with the drive circuitry for providing a connection with a least a low side switching transistor;
  a driver for driving a gate of a low side switching transistor;
  first circuitry for measuring a drain to source voltage across the low side switching transistor and generating a voltage output;
  second circuitry having a first state of operation for sampling the voltage output of the first circuitry when the low side switching transistor is turned on and having a second state of operation for sampling the voltage output of the first circuitry when the low side switching transistor is turned off, wherein the second circuitry further generates a monitored output current responsive to the sampled voltage output.

7. The apparatus of claim 6, wherein the first circuitry further comprises:
  a differential amplifier; and
  switching circuitry for configuring the differential amplifier as a level shifting differential amplifier in the first state of operation and for configuring the differential amplifier as a unity gain buffer in the second state of operation.

8. The apparatus of claim 6, wherein the second circuitry further comprises:
  first sampling circuitry for sampling the voltage output to generate a leading edge sample;
  second and third sampling circuitry for sampling the voltage output to generate a trailing edge sample; and
  a unity gain amplifier for averaging the leading edge sample and the trailing edge to generate the monitored output current proportional to a current through the low side switching transistor.

9. The apparatus of claim 8, further including pulse stretching circuitry for maintaining a turn on time of the low side switching transistor for a sufficient period of time to enable leading edge samples to be generated by the first sampling circuitry.

10. The apparatus of claim 8, further including a differential amplifier for generating a level shifted output current proportional to the current through the low side switching transistor level shifted by a predetermined level.

11. A method for generating a current proportional to a monitored current through a low-side switching transistor associated with a motor, comprising the steps of:
  driving a gate of the low side switching transistor to associated on and off states;
  measuring a drain to source voltage across the low side switching transistor;
  generating a voltage output responsive to the measured drain to source voltage;
  sampling the voltage output when the low side switching transistor is turned on in a first state of operation;
  sampling the voltage output when the low side switching transistor is turned off in a second state of operation; and
  generating a monitored output current through the low side switching transistor responsive to the sampled voltage output in the first and second states.

12. The method of claim 11, wherein the step of measuring the drain to source voltage further comprises the steps of
  determining whether the low-side switching transistor is in the first or second state of operation;
  configuring a differential amplifier measuring the drain to source voltage to operate as a level shifting differential amplifier in the first state of operation;
  measuring the drain to source voltage using the level shifting differential amplifier;
  configuring the differential amplifier measuring the drain to source voltage to operate as a unity gain buffer in the second state of operation; and
  measuring the drain to source voltage using the unity gain buffer.

13. The method of claim 12, wherein the step of configuring the differential amplifier as the unity gain buffer further comprises the step of disconnecting an external gain resistor from the differential amplifier.

14. The method of claim 11, wherein the step of sampling the voltage output in the first state, further comprises the steps of:
  sampling the voltage output to generate a leading edge sample;
  sampling the voltage output to generate a trailing edge sample; and
  averaging the leading edge sample and the trailing edge to generate an output current proportional to a current through the low side switching transistor.

15. The method of claim 14, further including the step of maintaining a turn on time of the
  low side switching transistor for a sufficient period of time to enable leading edge samples to be generated.

16. The method of claim 14, further including the step of generating a level shifted output current proportional to the current through the low side switching transistor level shifted by a predetermined level.

* * * * *